(12) United States Patent
Park et al.

(10) Patent No.: US 11,825,600 B2
(45) Date of Patent: Nov. 21, 2023

(54) PRINTED CIRCUIT BOARD, DISPLAY DEVICE, AND MANUFACTURING METHOD OF DISPLAY DEVICE

(71) Applicant: Samsung Display Co., LTD., Yongin-si (KR)

(72) Inventors: Tae Jin Park, Seoul (KR); Gyung Hyun Ko, Hwaseong-si (KR); Hee Ju Ma, Suwon-si (KR); Woo Jin Lee, Asan-si (KR); Yeon Je Cho, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 141 days.

(21) Appl. No.: 17/410,436

(22) Filed: Aug. 24, 2021

(65) Prior Publication Data

US 2022/0087015 A1 Mar. 17, 2022

(30) Foreign Application Priority Data

Sep. 11, 2020 (KR) ........................ 10-2020-0117012

(51) Int. Cl.
*H05K 3/28* (2006.01)
*H05K 1/02* (2006.01)

(52) U.S. Cl.
CPC ............. *H05K 1/0296* (2013.01); *H05K 3/28* (2013.01); *H05K 2201/10128* (2013.01)

(58) Field of Classification Search
CPC ................... H05K 3/28; H05K 1/0296; H05K 2201/10128; H05K 2201/0191
See application file for complete search history.

(56) References Cited

U.S. PATENT DOCUMENTS

2006/0148128 A1* 7/2006 Son ..................... G02F 1/13452
438/30
2020/0045833 A1* 2/2020 Asahina ................ H05K 1/118

FOREIGN PATENT DOCUMENTS

| CN | 109561577 | 4/2019 |
|---|---|---|
| JP | 2964730 | 10/1999 |
| JP | 2001-305570 | 10/2001 |
| KR | 10-1368043 | 2/2014 |

* cited by examiner

*Primary Examiner* — Sherman Ng
(74) *Attorney, Agent, or Firm* — KILE PARK REED & HOUTTEMAN PLLC

(57) ABSTRACT

Provided are a printed circuit board, a display device and a method of manufacturing a display device. The printed circuit board includes a base film including a first surface and a second surface, lead lines disposed on the first surface of the base film, and a first cover layer that covers at least a part of the lead lines and includes fill-in portions disposed between the lead lines. Each of the fill-in portions has a surface height less than a surface height of each of the lead lines with respect to the first surface of the base film.

14 Claims, 17 Drawing Sheets

PRINTED CIRCUIT BOARD, DISPLAY DEVICE, AND MANUFACTURING METHOD OF DISPLAY DEVICE

CROSS-REFERENCE TO RELATED APPLICATION(S)

This application claims priority to and benefits of Korean Patent Application No. 10-2020-0117012 under 35 U.S.C. § 119, filed on Sep. 11, 2020 in the Korean Intellectual Property Office, the disclosure of which is incorporated herein by reference in its entirety.

BACKGROUND

1. Field of the Disclosure

The disclosure relates to a printed circuit board, a display device, and a method of manufacturing a display device.

2. Description of the Related Art

A display device for displaying moving and/or still images may be used for various kinds of products such as televisions, notebook computers, monitors, digital signages, Internet of Things (IoT) devices, portable electronic devices such as mobile phones smartphones, tablet personal computers (PC), smart watches, watch phones, mobile communication terminals, electronic organizers, electronic books, portable multimedia players (PMP), navigation devices, ultra-mobile PCs (UMPC), and the like.

In order to drive light-emitting elements of a display device, required is a printed circuit board including a driving circuit, signal lines which electrically connect the light-emitting elements, and lead lines connected to the signal lines.

SUMMARY

Aspects of the disclosure provide a printed circuit board capable of simplifying manufacture processes and preventing lead lines from being migrated.

Aspects of the disclosure also provide a display device including the printed circuit board.

Aspects of the disclosure also provide a method of manufacturing a display device including the printed circuit board.

However, aspects of the disclosure are not restricted to those set forth herein. The above and other aspects of the disclosure will become more apparent to one of ordinary skill in the art to which the invention pertains by referencing the detailed description given below.

An embodiment of a printed circuit board may include a base film including a first surface and a second surface; a plurality of lead lines disposed on the first surface of the base film; and a first cover layer that covers at least a part of the plurality of lead lines and includes a plurality of fill-in portions disposed between the plurality of lead lines, and of the plurality of fill-in portions having a surface height less than a surface height of each of the plurality of lead lines with respect to the first surface of the base film.

The first cover layer may include a cover portion having a surface height greater than the surface height of each of the plurality of lead lines. The plurality of fill-in portions may expose an end portion of each of the plurality of lead lines, and the cover portion may cover a middle portion of each of the plurality of lead lines.

The plurality of fill-in portions may expose a surface of each of the plurality of lead lines and cover at least a part of side surfaces of each of the plurality of lead lines. The side surfaces of each of the plurality of lead lines may be connected to the surface of each of the plurality of lead lines. The plurality of fill-in portions may directly contact the first surface of the base film and the side surfaces of each of the plurality of lead lines. The cover portion may cover a surface of each of the plurality of lead lines and side surfaces which are connected to the surface. The cover portion and the plurality of fill-in portions may be integral with each other and include a same material.

The first cover layer may include a photosensitive insulating material. The photosensitive insulating material may include photosensitive polyimide. The plurality of fill-in portions and the plurality of lead lines may form an uneven structure. The first cover layer may include a stepped portion that exposes an end portion of each of the plurality of lead lines.

The first cover layer may be disposed directly on the first surface of the base film. The printed circuit board may further include a second cover layer disposed on the second surface of the base film. The first cover layer and the second cover layer may include a same material.

An embodiment of a display device may include a display panel including a plurality of signal lines; and a printed circuit board disposed on the display panel and including a base film, a plurality of lead lines disposed on a surface of the base film and electrically connected to the plurality of signal lines, a cover layer covering at least a part of the plurality of lead lines, and a plurality of fill-in portions disposed between the plurality of lead lines. Each of the fill-n portions may have a surface height less than a surface height of each of the plurality of lead lines with respect to the surface of the base film.

The cover layer may include a stepped portion that exposes an end portion of each of the plurality of lead lines. The cover layer may include a photosensitive insulating material.

An embodiment of a method of manufacturing a display device, the method may include applying a curable resin to a base film and a plurality of lead lines disposed on the base film; and forming a first curable pattern disposed between the plurality of lead lines. The first curable pattern may have a surface height less than a surface height of each of the plurality of lead lines by exposing and developing the curable resin.

The method may further include forming a second curable pattern having a surface height greater than the surface height of each of the plurality of lead lines. The forming of the first curable pattern and the forming of the second curable pattern may be simultaneously performed.

BRIEF DESCRIPTION OF THE DRAWINGS

The above and other aspects and features of the disclosure will become more apparent by describing in the embodiments thereof with reference to the attached drawings, in which.

DETAILED DESCRIPTION OF THE EMBODIMENTS

Figure 1:
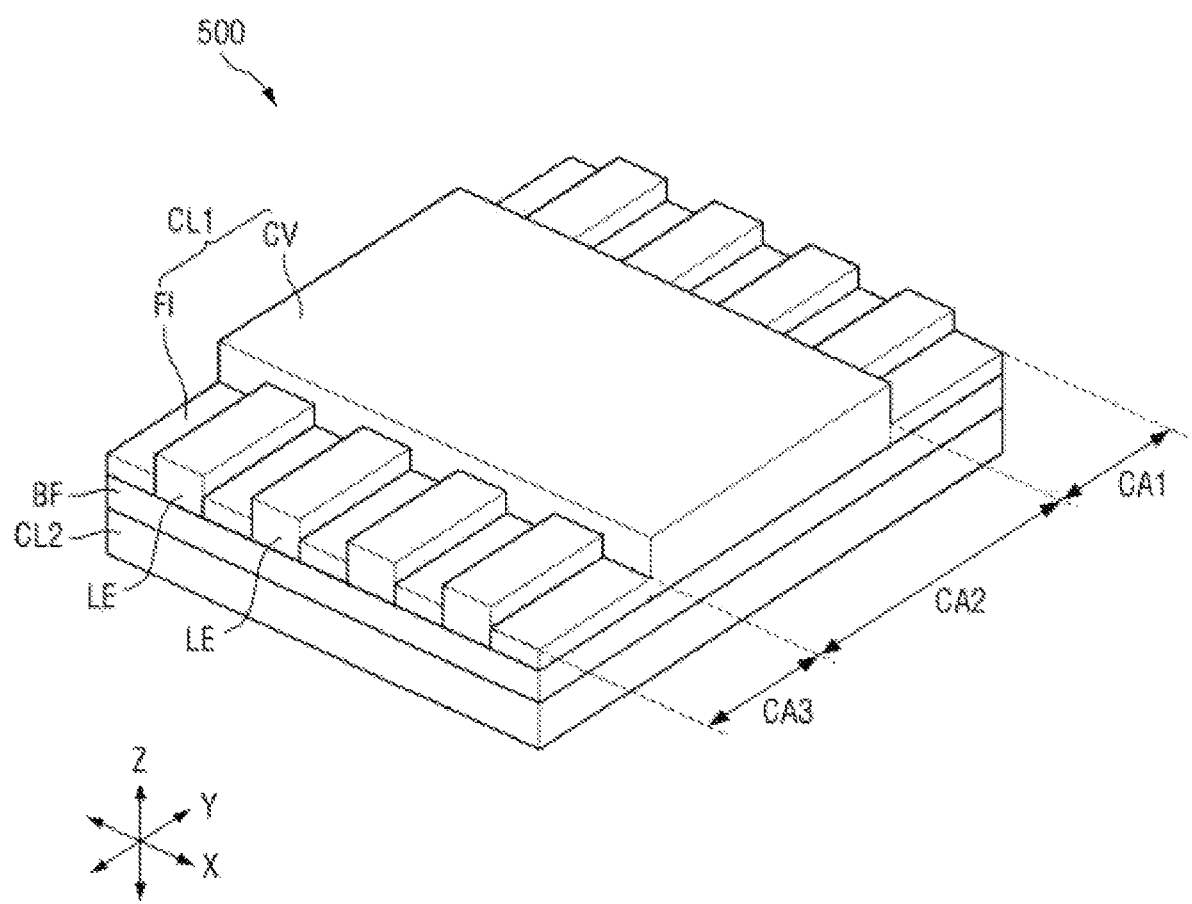
FIG. 1 is a perspective view of a printed circuit board according to an embodiment.

The embodiments will now be described more fully hereinafter with reference to the accompanying drawings. However, the embodiments of the disclosure are limited to those set forth herein. Rather, the embodiments are provided so that this disclosure will be thorough and complete, and will fully convey the scope of the invention to those skilled in the art. The same reference numbers indicate the same components throughout the specification. In the attached figures, the thicknesses of layers and regions may be exaggerated for clarity.

It will also be understood that when a layer is referred to as being "on" another layer or substrate, it can be directly on the other layer or substrate, or indirectly such as intervening layers may also be present. In contrast, when an element is referred to as being "directly on" another element, there are no intervening elements present.

When an element, such as a layer, is referred to as being "connected to," or "coupled to" another element or layer, it may be connected to, or coupled to the other element or layer or intervening elements or layers may be present. When, however, an element or layer is referred to as being "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one or an elements' relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features may then be oriented "above" the other elements or features. Thus, the example term "below" can encompass both an orientation of above and below. Furthermore, the apparatus may be otherwise oriented (for example, rotated 90 degrees or at other orientations), and, as such, the spatially relative descriptors used herein interpreted accordingly.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Hereinafter, the embodiments will be described with reference to the accompanying drawings.

Figure 2:
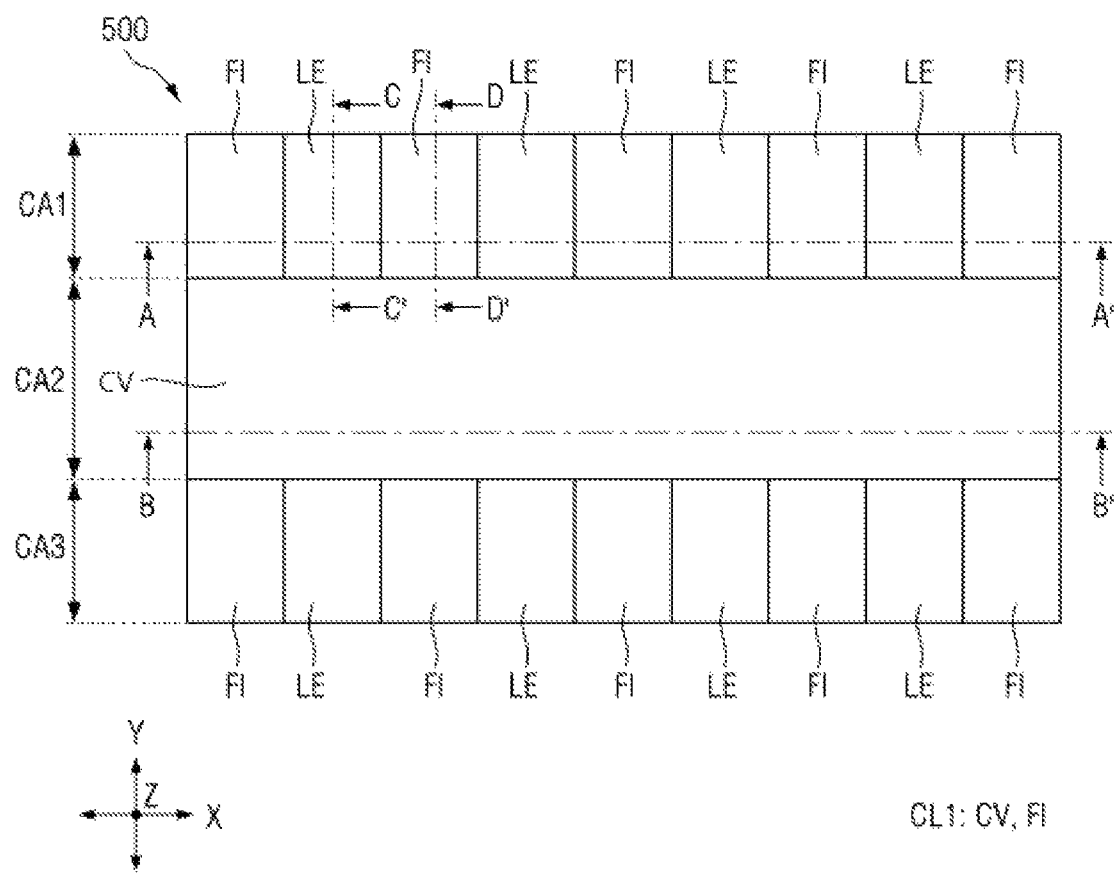
FIG. 2 is a plan view of the printed circuit board according to an embodiment.
Figure 3:
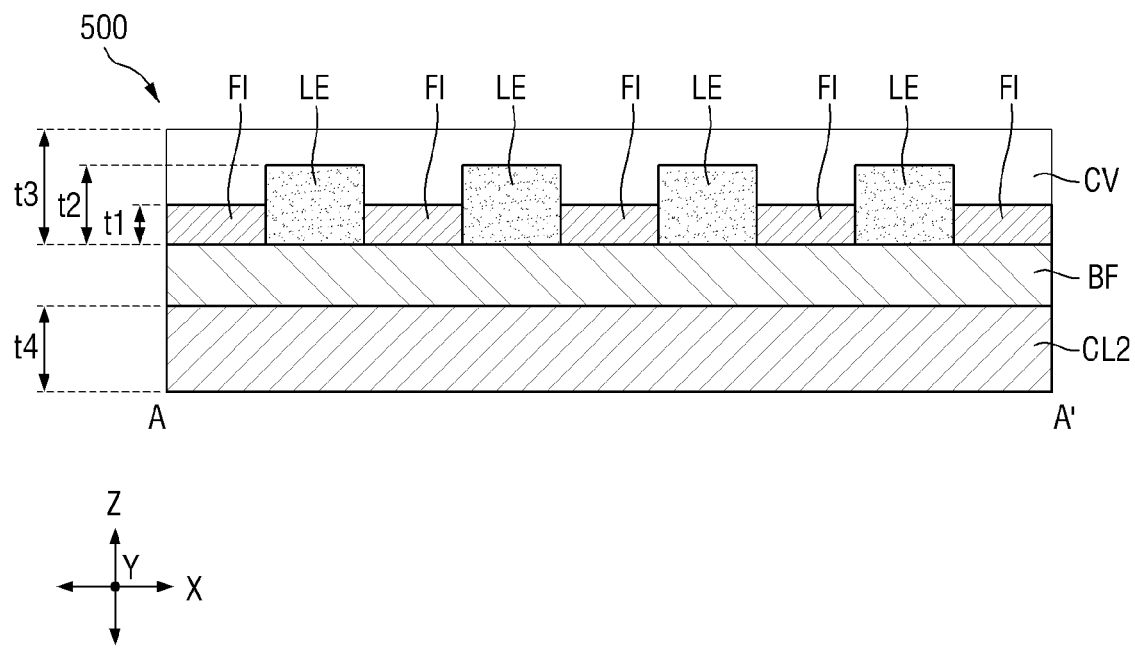
FIG. 3 is a cross-sectional view taken along line A-A' of FIG. 2.
Figure 4:
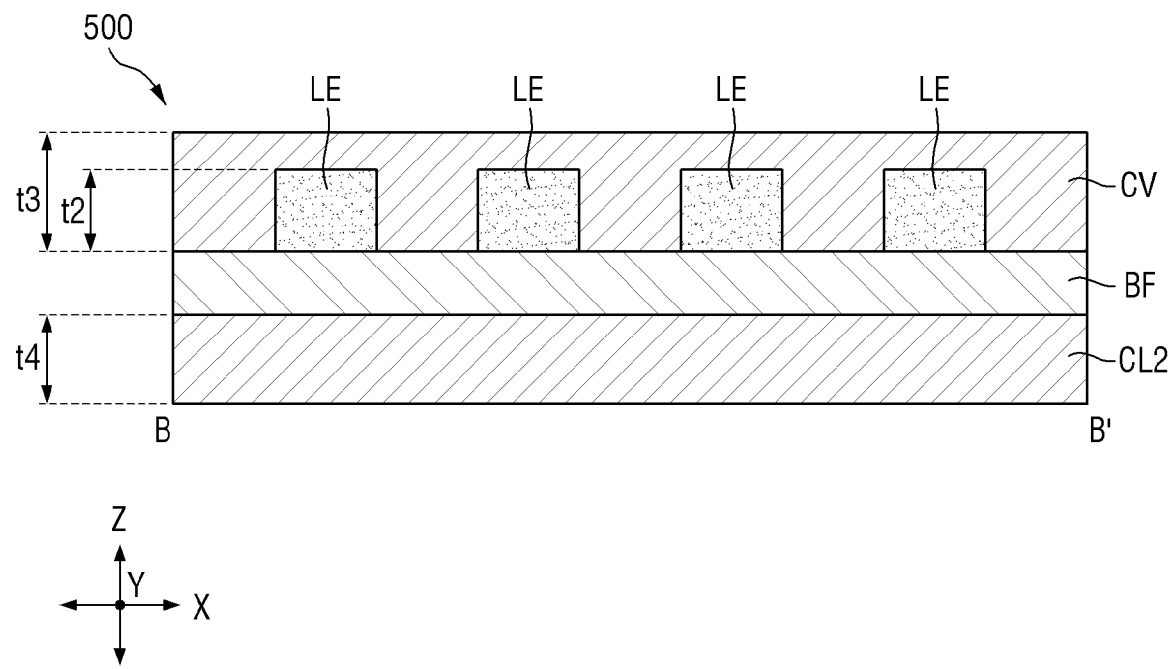
FIG. 4 is a cross-sectional view taken along line B-B' of FIG. 2.
Figure 5:
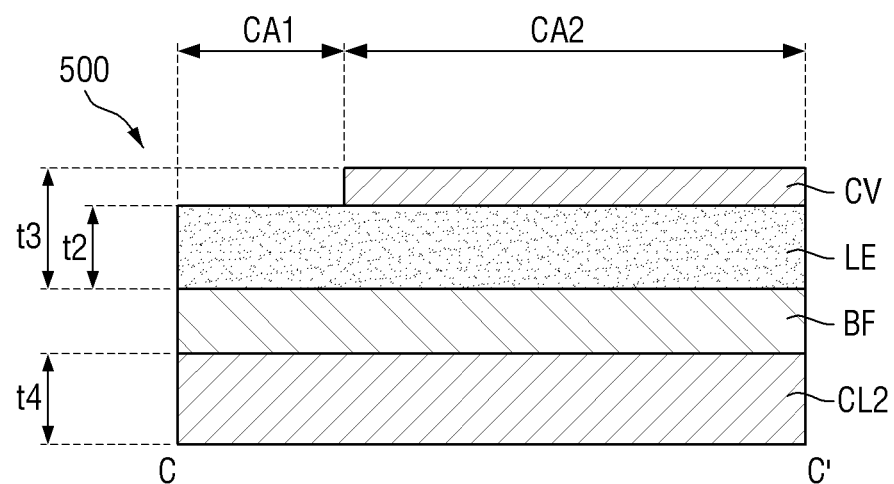
FIG. 5 is a cross-sectional view taken along line C-C' of FIG. 2.
Figure 5:
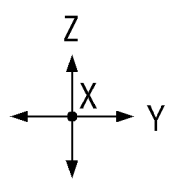
Figure 6:
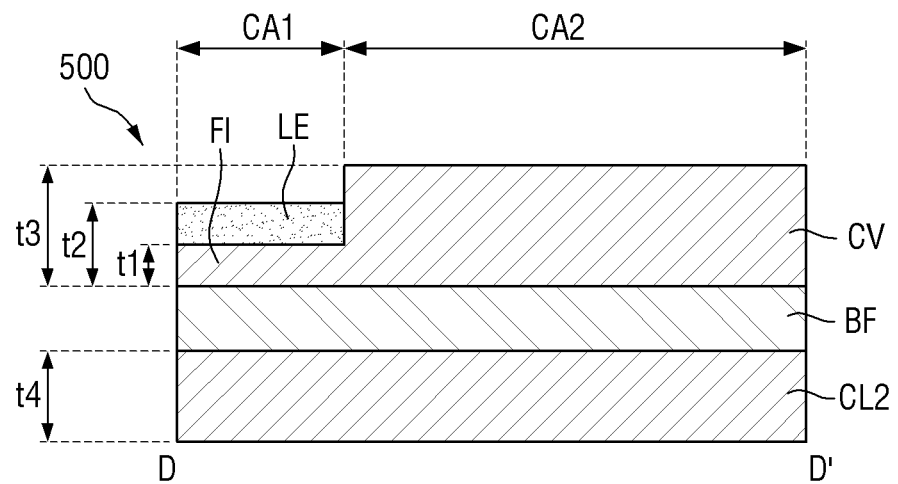
FIG. 6 is a cross-sectional view taken along line D-D' of FIG. 2.

FIG. 1 is a perspective view of a printed circuit board according to an embodiment. FIG. 2 is a plan view of the printed circuit board according to an embodiment. FIG. 3 is a cross-sectional view taken along line A-A' of FIG. 2. FIG. 4 is a cross-sectional view taken along line B-B' of FIG. 2. FIG. 5 is a cross-sectional view taken along line C-C' of FIG. 2. FIG. 6 is a cross-sectional view taken along line D-D' of FIG. 2.

Hereinafter, a first direction X, a second direction Y, and a third direction Z intersect extending in different directions. In an embodiment, the first direction X, the second direction Y, and the third direction Z may intersect so as to be perpendicular to each other, the first direction X may be a transverse direction, the second direction Y may be a longitudinal direction, and the third direction Z may be a thickness direction. Each of the first direction X, the second direction Y, and/or the third direction Z may include two or more directions. For example, the third direction Z may include an upward direction and a downward direction. A surface (or a first surface) of a member disposed to face the upward direction may be referred to as an upper surface thereof, and another surface (or a second surface) of the member disposed to face the downward direction may be referred to as a lower surface thereof. However, the above-mentioned directions are not limited thereto.

A printed circuit board 500 is a circuit component capable of transmitting electrical signals. Various electronic components such as resistors, capacitors, and integrated circuits may be mounted on the printed circuit board 500. The printed circuit board 500 may be applied to a variety of electronic devices ranging from home appliances to advanced devices such as smartphones.

The printed circuit board 500 may be rigid or flexible. In embodiments, the printed circuit board 500 may be implemented as a thin film type.

The printed circuit board 500 may be a flexible printed circuit board 500 for a display device, which is attached to a display panel applied to the display device, for example, a mobile terminal, a television, or the like, and transmits signals to the display panel, but the disclosure is not limited thereto. Hereinafter, for convenience of description, the flexible printed circuit board 500 is referred to as the printed circuit board 500.

Referring to FIGS. 1 to 6, in an embodiment, the printed circuit board 500 is illustrated as having a rectangular shape in a plan view, but the shape of the printed circuit board 500 is not limited thereto. In embodiments, the printed circuit board 500 may have various regular or irregular shapes such as a triangular shape, a circular shape, an elliptical shape, a branched shape, or the like.

The printed circuit board 500 may include a plurality of areas. The areas may include a first circuit area CA1, a second circuit area CA2, and a third circuit area CA3.

Each of the first circuit area CA1 and the third circuit area CA3 may be disposed adjacent to an edge of the printed circuit board 500, and the second circuit area CA2 may be disposed at a middle portion of the printed circuit board 500. In an embodiment, as illustrated in FIGS. 1 and 2, the first circuit area CA1 and the third circuit area CA3 may be disposed on both sides of a base film BF extending in the first direction X, and the second circuit area CA2 may be disposed between the first circuit area CA1 and the third circuit area CA3. In embodiments, at least one of the first circuit area CA1 and the third circuit area CA3 may be disposed on one side of the base film BF extending in the second direction Y. In embodiments, the first circuit area CA1 and the second circuit area CA2 may be disposed in the middle portion of the printed circuit board 500. In an embodiment, the first circuit area CA1, the second circuit area CA2, and the third circuit area CA3 are disposed to have a rectangular shape in a plan view, but the disclosure is not limited thereto.

The first circuit area CA1 and the third circuit area CA3 may be areas electrically connected to other electronic devices or components. The first circuit area CA1 and the third circuit area CA3 may be areas overlapping other electronic devices or components. The first circuit area CA1 and the third circuit area CA3 may be areas in which end portions of lead lines LE to be described below are exposed.

The second circuit area CA2 may connect the first circuit area CA1 and the third circuit area CA3 to each other. The second circuit area CA2 may be an area that is not electrically connected to other electronic devices or components. The second circuit area CA2 may be an area to be covered so that the lead lines LE to be described below are insulated.

The printed circuit board 500 includes the base film BF, the lead lines LE, and a first cover layer CL1. The printed circuit board 500 may further include a second cover layer CL2.

The base film BF may be flexible and thus may be bent. The base film BF may include a flexible material. For example, the base film BF may include polyimide, but the disclosure is not limited thereto.

The lead lines LE may be disposed to be spaced apart from each other on a first surface of the base film BF. The first surface of the base film BF may be an upper surface of the base film BF.

Each of the lead lines LE may have an approximately rectangular cross-section. The lead lines LE may be disposed to cross the first circuit area CA1, the second circuit area CA2, and the third circuit area CA3. The lead lines LE may be disposed to have a long stripe shape in the second direction Y in a plan view, but the disclosure is not limited thereto.

The lead line LE may include first surface, second surface opposite to the first surface, and at least one side surface connecting an edge of the first surface and an edge of the second surface. A surface of the lead line LE may be a surface, at least a portion of which is covered by the first cover layer CL1 to be described below, and another surface of the lead line LE may be a surface facing the surface of the base film BF. For example, the surface and the another surface of the lead line LE may be an upper surface and a lower surface thereof, respectively. The another surface of the lead line LE may be in direct contact with the first surface of the base film BF.

The lead line LE may include a conductive material. Examples of the conductive material may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The lead line LE may include at least one end portion disposed in the first circuit area CA1 and/or the third circuit area CA3 and a middle portion disposed in the second circuit area CA2.

The end portions of the lead line LE may be exposed to the outside. The end portions of each of the lead lines LE may include one end disposed in the first circuit area CA1 and the other end disposed in the third circuit area CA3. The end portion of the lead line LE may refer to the above-described end and a portion of the lead line LE, which is adjacent and connected to the end.

In an embodiment, one end and the other end of the lead line LE may be exposed to the outside in the first circuit area CA1 and the third circuit area CA3, respectively, and the middle portion between the one end and the other end may be covered by the first cover layer CL1 to be described below in the second circuit area CA2.

First surface and at least one side surface of the end portion of the lead line LE may be exposed to the outside. In more detail, as illustrated in FIG. 3, in the end portions of each of the lead lines LE disposed in the first circuit area CA1 and the third circuit area CA3, an upper surface, one side surface extending in the first direction X, and both side surfaces extending in the second direction Y may be exposed to the outside. For example, first surface and at least one side surface of the end portion of each of the lead lines LE may not be covered by the first cover layer CL1 to be described below. Some portions (or at least a part) of both side surfaces extending in the second direction Y may be exposed to the outside, and other portions thereof may be covered by a fill-in portion FI to be described below.

The middle portion of the lead line LE may not be exposed to the outside. As illustrated in FIG. 5, first surface and both side surfaces of the middle portion of the lead line LE may be covered by a cover portion CV of the first cover layer CL1 to be described below.

In an embodiment, as illustrated in FIGS. 1, 2, and 6, the end portion of the lead line LE may be aligned with an edge of the base film BF, but the disclosure is not limited thereto. In embodiments, the end portion of the lead line LE may be disposed away from an end portion of the base film BF.

The first cover layer CL1 may be disposed on the lead lines LE and/or the base film BF. The first cover layer CL1 may be disposed so as to be in direct contact with the lead lines LE and/or the base film BF. The first cover layer CL1 may be disposed over the first circuit area CA1, the second circuit area CA2, and the third circuit area CA3. The first cover layer CL1 may cover the lead lines LE such that the end portions of the lead lines LE disposed in the first circuit area CA1 and the third circuit area CA3 may be exposed, and the middle portions of the lead lines LE disposed in the second circuit area CA2 may not be exposed.

The first cover layer CL1 may include a material with flexibility. For example, the first cover layer CL1 may include polyimide, but the disclosure is not limited thereto. The first cover layer CL1 includes an insulating material and may further include a photosensitive material. For example, the first cover layer CL1 may include photosensitive polyimide (PSPI). The first cover layer CL1 may be integrally formed through an exposure and development process using ultraviolet light having a wavelength range of about 350 nm to about 450 nm. The exposure and development process will be described in detail in the following with reference to FIGS. 13 to 17.

The first cover layer CL1 may include the cover portion CV and at least one fill-in portion FI.

The cover portion CV may be disposed in the second circuit area CA2. The cover portion CV may cover the lead lines LE. In more detail, as illustrated in FIGS. 1, 4, and 6, the cover portion CV may cover the middle portion of each of the lead lines LE disposed in the second circuit area CA2. In the second circuit area CA2, the cover portion CV is disposed on the lead lines LE, and spaces between the lead lines LE may be filled by the cover portion CV. For example, a surface of the middle portion of the lead line LE and both side surfaces thereof connected to edges of the first surface may be completely surrounded by the cover portion CV. The cover portion CV may be in direct contact with the middle portions of the lead lines LE. Thus, the middle portions of the lead lines LE may not be exposed to the outside. In an embodiment, the cover portion CV is disposed to have a rectangular shape in a plan view, but the disclosure is not limited thereto.

The fill-in portions FI may be disposed in the first circuit area CA1 and/or the third circuit area CA3. The fill-in portions FI may be disposed in spaces formed between the end portions of the lead lines LE and may be filled in the spaces. A plurality of fill-in portions may be disposed between the lead lines LE. A side surface of the fill-in portion FI may be in direct contact with the side surface of the lead line LE. The side surface of the fill-in portion FI may partially cover the side surface of the lead line LE. A lower surface of the fill-in portion FI may be in direct contact with the upper surface of the base film BF. An upper surface of the fill-in portion H may be exposed to the outside. As illustrated in FIG. 2, the fill-in portion H may have a shape protruding from the cover portion CV in the second direction Y in a plan view. In an embodiment, as illustrated in FIG. 3, the fill-in portion FI may have a rectangular cross-section, but the disclosure is not limited thereto. In an embodiment, as illustrated in FIG. 6, an end portion of the fill-in portion FI may extend to an end of the base film BF, but the disclosure is not limited thereto. In embodiments, the end portion of the fill-in portion FI may be disposed away from the end of the base film BF.

The cover portion CV and the fill-in portion H may be integral with each other. The cover portion CV and the fill-in portion H may be made of the same material, for example, a material including photosensitive polyimide. The cover portion CV and the fill-in portion H may be implemented as a single layer of which portions having different thickness or different surface height. The cover portion CV and the fill-in portion FI may be integrally formed by applying an ink composition including photosensitive polyimide on the base film BF and by performing an exposure and development process on the ink composition. In embodiments, the cover portion CV and the fill-in portion FI may be made of different materials. In embodiments, the cover portion CV may include at least one of a coverlay, a photoimageable solder resist (PSR), and a protective layer.

The second cover layer CL2 may be disposed on a second surface of the base film BF. The second cover layer CL2 may be disposed to be in direct contact with the second surface of the base film BF. The second cover layer CL2 may cover the second surface of the base film BF and/or components mounted on the second surface of the base film BF. In an embodiment, the first and second cover layers CL1 and CL2 may include the same material. A surface of the second cover layer CL2 faces the second surface of the base film BF, and another surface of the second cover layer CL2 may be exposed to the outside. In embodiments, the second cover layer CL2 may include at least one of a coverlay, a photo imageable solder resist (PSR), and a protective layer.

In the following, the surface height may be a distance from the first surface of the base film BF or the second surface of the base film BF to the first surface of an arbitrary member. The distance may be a distance measured in the third direction Z. In embodiments, the surface height may be the maximum value of thicknesses of arbitrary members.

The fill-in portion FI, the lead line LE, the cover portion CV, and the second cover layer CL2 may be disposed to have a first surface height t1, a second surface height t2, a third surface height t3, and a fourth surface height t4, respectively. As illustrated in FIGS. 3 to 6, the first surface height t1 may be a distance from the first surface of the base film BF to a surface of the fill-in portion FI, the second surface height t2 may be a distance from the first surface of the base film BF to a surface of the lead line LE, the third surface height t3 may be a distance from the first surface of the base film BF to the upper surface of the cover portion CV, and the fourth surface height t4 may be a distance from the second surface of the base film BF to the another surface of the second cover layer CL2.

The first surface height t1 may be less than the second surface height t2. The fill-in portion FI may be disposed to have a thickness less than that of the lead line LE. The lead line LE may be disposed to protrude further in one side direction than the fill-in portion FI. The one side direction may be an upward direction. Accordingly, in the first circuit area CA1 and the third circuit area CA3, the fill-in portion FI and the lead line LE may form an uneven structure. A portion of the side surface of the lead line LE may be exposed, and another portion thereof may be covered by the fill-in portion FI.

The second surface height t2 may be greater than the first surface height t1 but may be less than the third surface height t3. The thickness of the lead line LE may be greater than that of the fill-in portion FI and may be less than the maximum thickness of the cover portion CV. The lead line LE may be disposed to be recessed in the other side direction on the basis of (or with respect to) a surface of the cover portion CV. The other side direction may be a downward direction. For example, the lead line LE may be completely covered by the cover portion CV in the second circuit area CA2 and may be partially exposed in the first circuit area CA1 and the third circuit area CA3.

The fourth surface height t4 may be substantially equal to the third surface height t3. In embodiments, the fourth surface height t4 may be less than the third surface height t3. In embodiments, the fourth surface height t4 may be greater than the first surface height t1 and/or the second surface height t2 and less than the third surface height t3.

As illustrated in FIGS. 1 and 6, the fill-in portion F1 and the cover portion CV may have different surface heights and/or thicknesses, thereby forming a stepped portion. A portion of a side surface of the cover portion CV may be exposed. The lead line LE may be disposed to pass through the side surface of the cover portion CV. In one embodiment, as illustrated in FIG. 1, the fill-in portion FI and the cover portion CV may form two stepped portions each extending in the first direction X at a boundary of the first circuit area CA1 and the second circuit area CA2 and a boundary of the second circuit area CA2 and the third circuit area CA3. In embodiments, the surface heights of the fill-in portion FI disposed in the first circuit area CA1 and the fill-in portion FI disposed in the third circuit area CA3 may be equal to each other. In embodiments, the surface heights of the fill-in portion FI disposed in the first circuit area CA1 and the fill-in portion FI disposed in the third circuit area CA3 may be different from each other.

Figure 7:
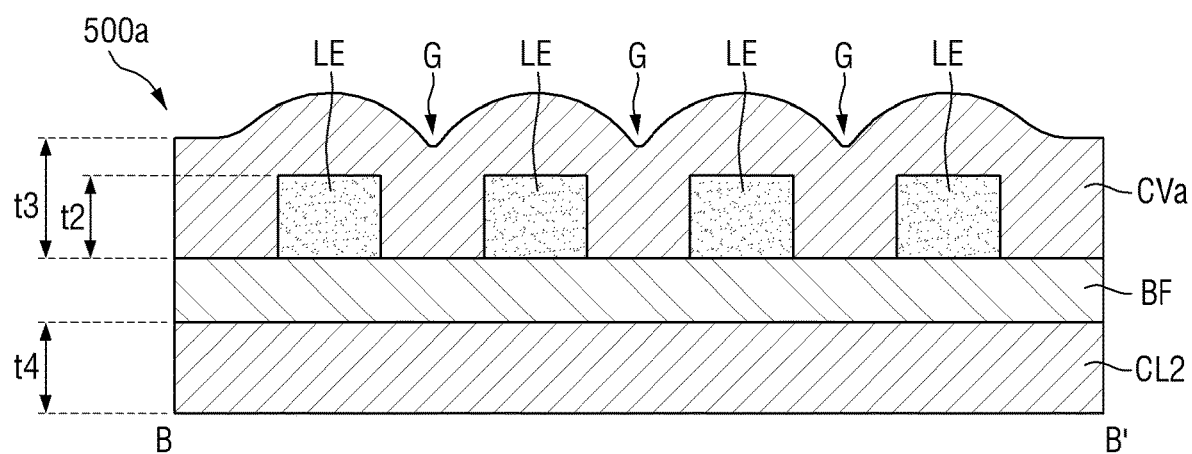
FIG. 7 is a cross-sectional view of a printed circuit board according to an embodiment.
Figure 7:
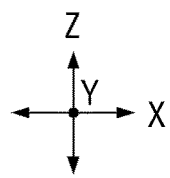

FIG. 7 is a cross-sectional view of a printed circuit board according to an embodiment.

The embodiment illustrated in FIG. 7 is different from the embodiment illustrated in FIGS. 1 to 6 in that grooves G may be formed on first surface of a cover portion CVa.

Referring to FIG. 7, in contrast to the embodiment illustrated in FIGS. 1 to 6, an upper surface of the cover portion CVa may have a shape, which corresponds to a shape of first surface of a base film BF and a shape of an uneven portion formed due to a plurality of lead lines LE disposed on the first surface of the base film BF. A surface of the cover portion CVa may be the upper surface of the cover portion CVa. In more detail, a portion of a surface of the cover portion CVa overlapping the lead line LE in a thickness direction protrudes upward, and another portion of a surface of the cover portion CVa disposed in a space between the lead lines LE may be recessed downward. A plurality of grooves G may be formed on a surface of the cover portion CVa between the lead lines LE. A third surface height t3 from the first surface of the base film BF to a surface of the cover portion CVa may be varied. The maximum value of the third surface height t3 may be greater than a second surface height t2 from the first surface of the base film BF to a surface of the lead line LE. The minimum value of the third surface height t3 may be greater than the second surface height t2 from the first surface of the base film BF to a surface of the lead line LE. In embodiments, the minimum value of the third surface height t3 may be less than or equal to the second surface height t2.

Figure 8:
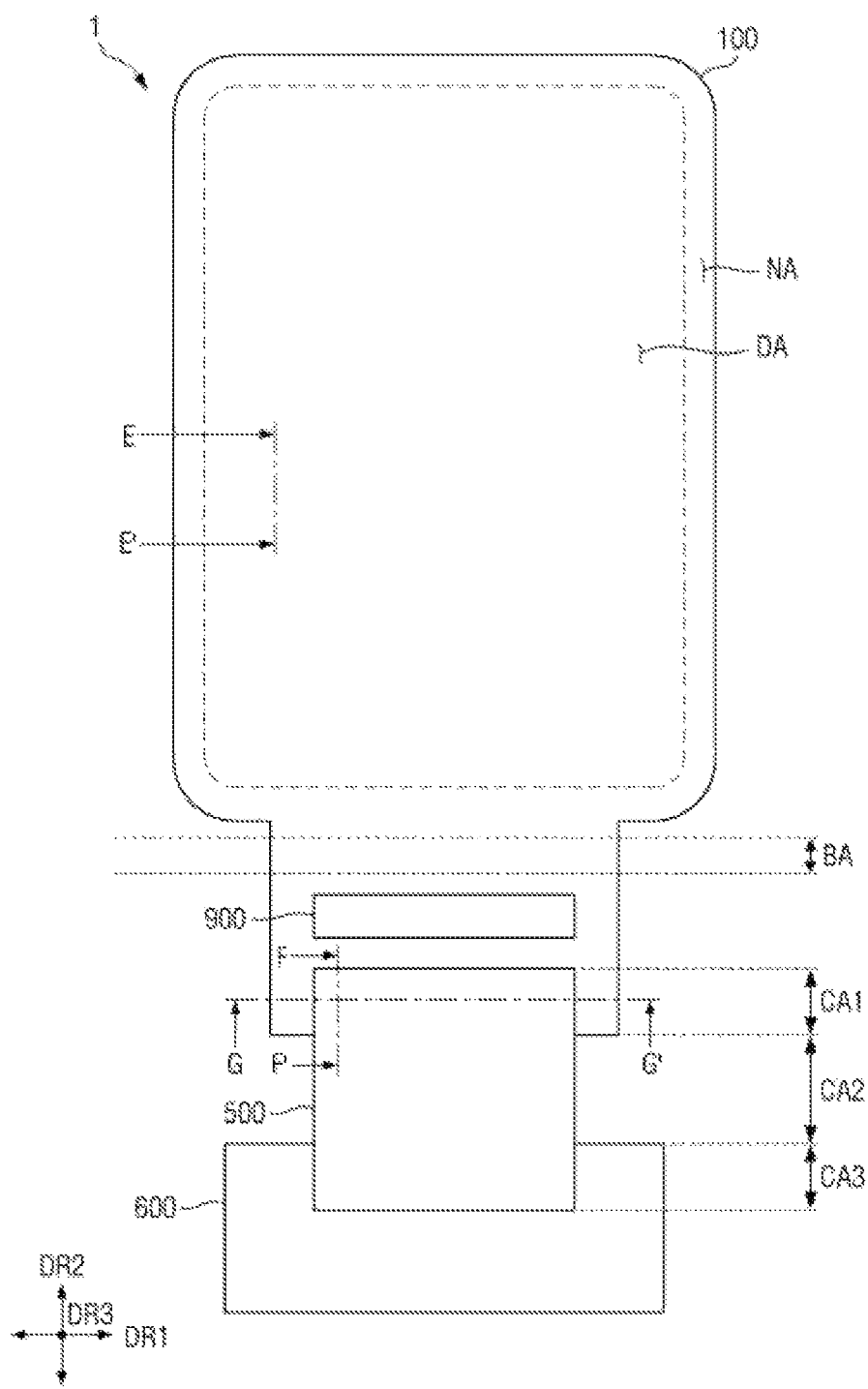
FIG. 8 is a plan view of a display device according to an embodiment.
Figure 9:
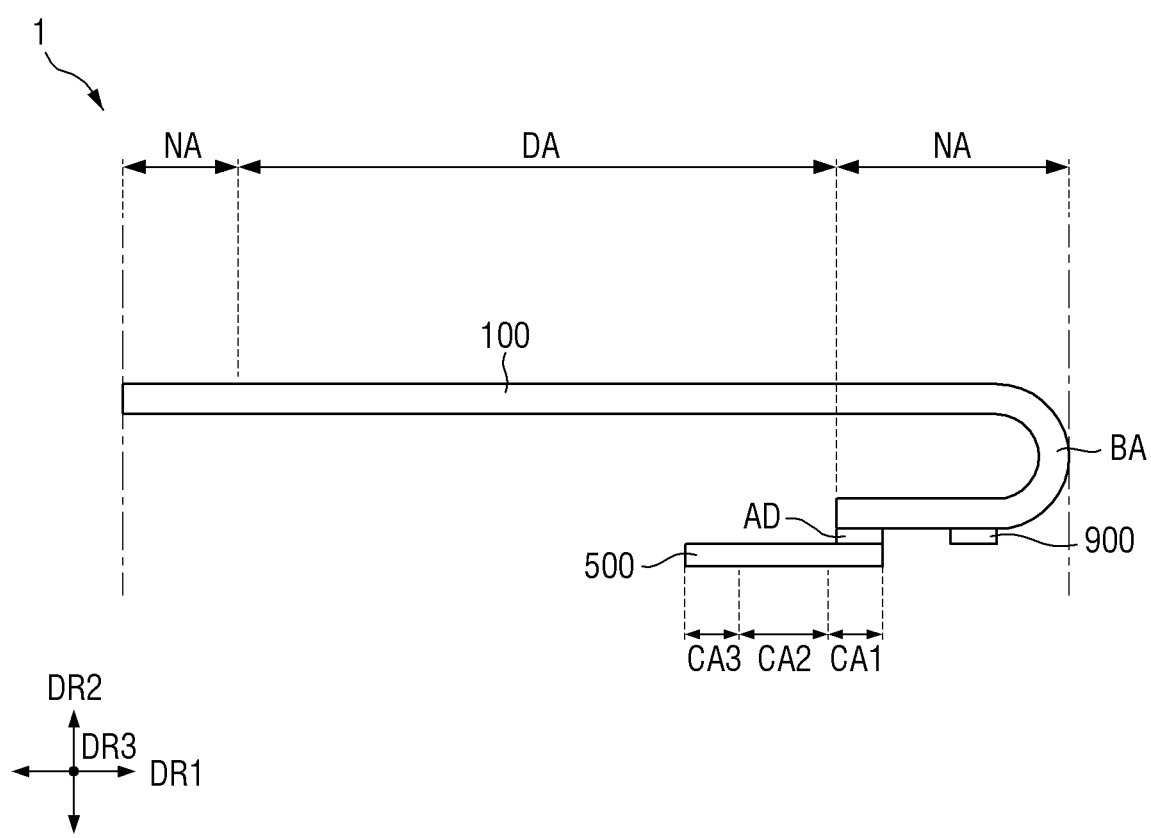
FIG. 9 is a side view of the display device according to an embodiment in which a display panel is bent.
Figure 10:
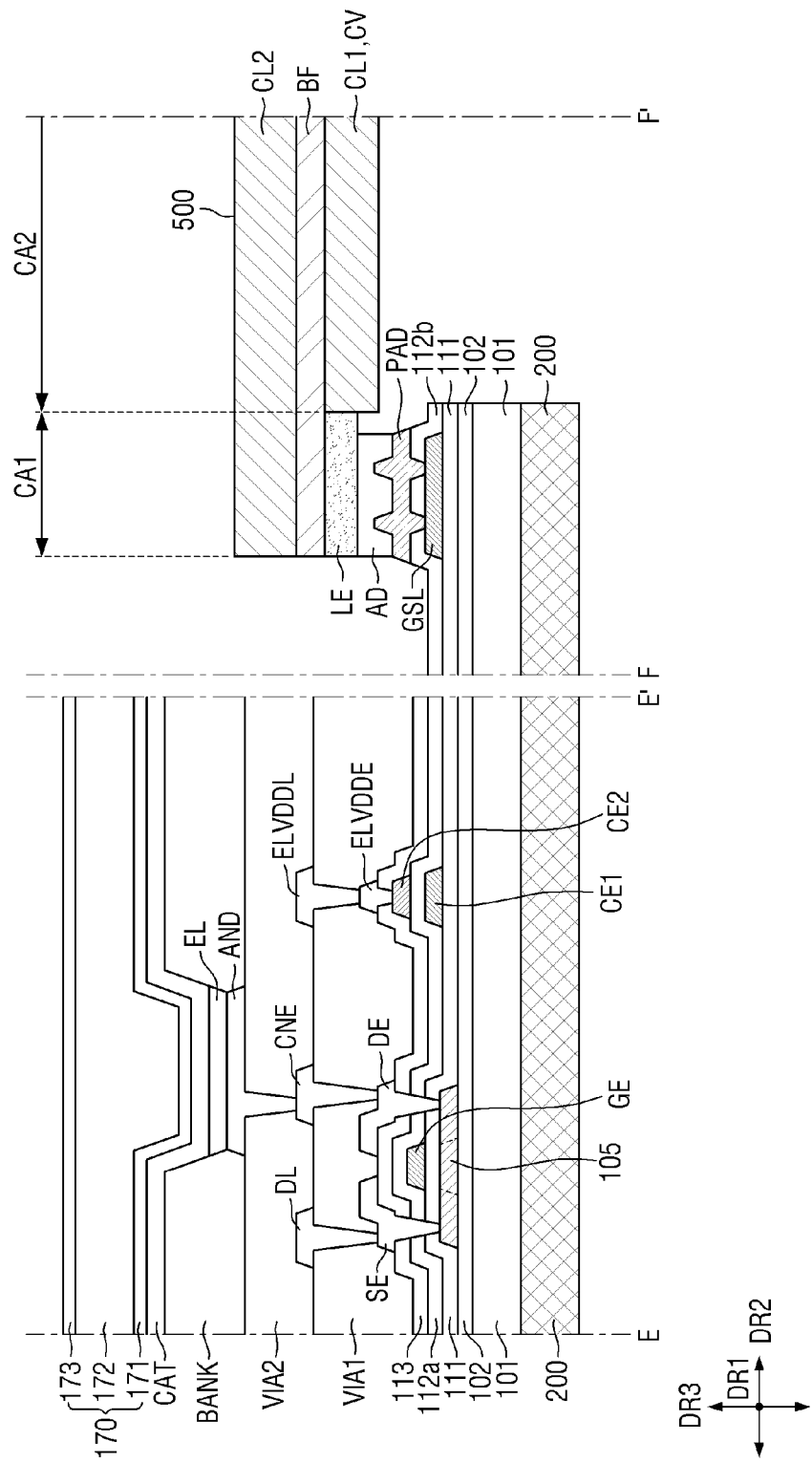
FIG. 10 is a set of cross-sectional views taken along line E-E' and line F-F' of FIG. 8.
Figure 11:
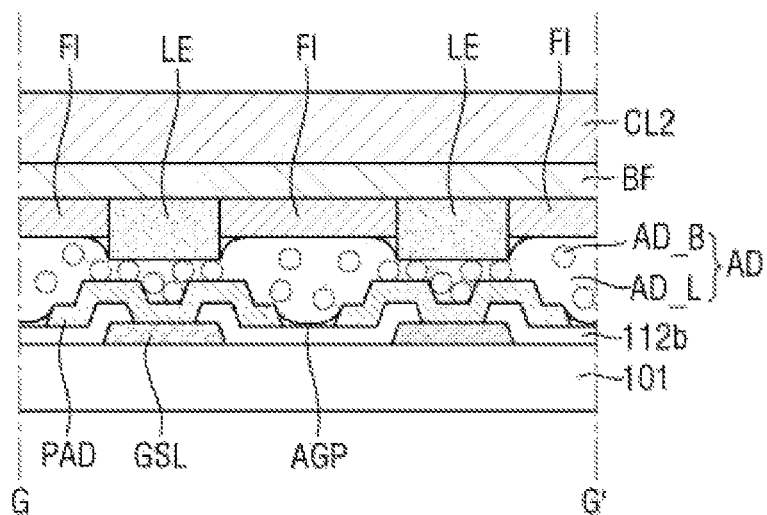
FIG. 11 is a cross-sectional view taken along line G-G' of FIG. 8.
Figure 11:
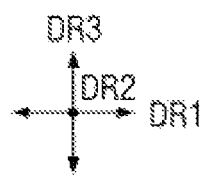

FIG. 8 is a plan view of a display device according to an embodiment. FIG. 9 is a side view of the display device according to an embodiment in which a display panel is bent. FIG. 10 is a set of cross-sectional views taken along line E-E' and line F-F' of FIG. 8. FIG. 11 is a cross-sectional view taken along line G-G' of FIG. 8.

Hereinafter, a first direction DR1, a second direction DR2, and a third direction DR3 intersect in different directions. In an embodiment, the first direction DR1, the second direction DR2, and the third direction DR3 may intersect so as to be perpendicular to each other, the first direction DR1 may be a transverse direction, the second direction DR2 may be a longitudinal direction, and the third direction DR3 may be a thickness direction. Each of the first direction DR1, the second direction DR2, and/or the third direction DR3 may include two or more directions. For example, the third direction DR3 may include an upward direction and a downward direction. First surface of a member disposed to face the upward direction may be referred to as an upper surface, and the second surface of the member disposed to face the downward direction may be referred to as a lower surface. The first direction DR1, the second direction DR2, and the third direction DR3 may be substantially identical to or different from the first direction X, the second direction Y, and the third direction Z of FIGS. 1 to 7, respectively. However, the above-described directions are not limited thereto.

A display device 1 is a device for displaying a video or a still image. The display device 1 may be used as a display screen for various kinds of products such as a television, a notebook computer, a monitor, digital signage, and an Internet of Things (IoT) device, as well as portable electronic devices such as a mobile phone, a smartphone, a tablet personal computer (PC), a smart watch, a watch phone, a mobile communication terminal, an electronic organizer, an electronic book, a portable multimedia player (PMP), a navigation device, and an ultra-mobile PC (UMPC).

Referring to FIGS. 8 and 9, the display device 1 may include a display panel 100 configured to display an image, a printed circuit board 500 connected to the display panel 100, and a main circuit board 600 connected to the printed circuit board 500.

As the display panel 100, for example, an organic light-emitting display panel 100 may be applied. In the following embodiments, an example in which an organic light-emitting display panel is applied as the display panel 100 is illustrated, but the disclosure is not limited thereto, and other types of display panels, such as a liquid crystal display (LCD) panel, a quantum dot organic light-emitting diode (QD-OLED) display panel, a quantum dot LCD (QD-LCD) panel, a quantum nano light-emitting display (QNED) panel, and a micro light-emitting display (Micro LED) panel, and the like may be applied as the display panel 100.

The display panel 100 includes a display area DA including a plurality of pixels and a non-display area NA disposed around the display area DA.

The display area DA may have a rectangular shape in which each corner has a right angle in a plan view or a rectangular shape in which each corner is round in a plan view. The display area DA may have short sides and long sides. The short sides of the display area DA may be sides which extend in the first direction DR1. The long sides of the display area DA may be sides which extend in the second direction DR2. However, a planar shape of the display area DA is not limited to the rectangular shape, and the display area DA may have various shapes such as a circular shape, an elliptical shape, or the like. The non-display area NA may be disposed adjacent to both short sides and both long sides of the display area DA. The non-display area NA may surround all sides of the display area DA and form an edge of the display area DA. However, the disclosure is not limited thereto, and the non-display area NA may be disposed adjacent to only both short sides or only both long sides of the display area DA.

The display panel 100 may further include a driving integrated circuit 900 that is attached between the display area DA and one side of the display panel 100 and drives a pixel circuit of the display panel 100. The one side may be a lower side of the display panel 100 extending in the first direction DR1. The driving integrated circuit 900 may be, for example, a chip on plastic (COP) or a chip on glass (COG). The driving integrated circuit 900 may be disposed on first surface of the display panel 100. The first surface of the display panel 100 may be a surface on which an image is displayed. The first surface may be a surface to which the printed circuit board 500 is attached. In embodiments, the driving integrated circuit 900 may be disposed on the second surface of the display panel 100 which is a surface opposite to the first surface.

The printed circuit board 500 may be attached to a lower end of the display panel 100. The printed circuit board 500 may electrically connect the display panel 100 and the main circuit board 600.

The printed circuit board 500 may be the printed circuit board 500 illustrated in FIGS. 1 to 7. A first circuit area CA1 of the printed circuit board 500 may be attached to the display panel 100, and a third circuit area CA3 of the printed circuit board 500 may be attached to the main circuit board 600. As illustrated in FIG. 9, the printed circuit board 500 may be bent in the thickness direction such that a portion of the printed circuit board 500 overlaps the display panel 100.

The display device 1 may further include an adhesive member AD which is disposed between the display panel 100 and the first circuit area CA1 of the printed circuit board 500 and bonds the display panel 100 and the printed circuit board 500. The adhesive member AD will be described in detail in the following with reference to FIG. 11.

The main circuit board 600 may be attached to the third circuit area CA3 of the printed circuit board 500. The main circuit board 600 may include a circuit pad area attached to the third circuit area CA3 of the printed circuit board 500. A plurality of circuit pads may be disposed in the circuit pad area and connected to a plurality of lead lines LE of the printed circuit board 500. In embodiments, the main circuit board 600 and/or the third circuit area CA3 may be omitted.

Referring to FIG. 10 further, the display panel 100 may include a display substrate 101, a plurality of conductive layers, a plurality of insulating layers insulating the conductive layers, an organic layer EL, and the like.

The display substrate 101 is disposed over an entirety of the display area DA and the non-display area NA. The display substrate 101 may perform a function of supporting a variety of elements disposed thereabove. In an embodiment, the display substrate 101 may be a rigid substrate including a rigid material such as flexible glass, quartz, or the like. However, the disclosure is not limited thereto, and the display substrate 101 may be a flexible substrate including a flexible material such as polyimide (PI) or the like.

A buffer layer 102 may be disposed on the display substrate 101. The buffer layer 102 may prevent moisture and oxygen from penetrating from the outside through the display substrate 101. The buffer layer 102 may include one of a silicon nitride ($SiN_x$) film, a silicon oxide ($SiO_2$) film, and a silicon oxynitride ($SiO_xN_y$) film.

A semiconductor layer 105 may be disposed on the buffer layer 102. The semiconductor layer 105 forms a channel of a thin film transistor. The semiconductor layer 105 may be disposed in each pixel of the display area DA and may be disposed even in the non-display area NA. The semiconductor layer 105 may include a source/drain area and an active area. The semiconductor layer 105 may include polycrystalline silicon.

A first insulating layer 111 may be disposed on the semiconductor layer 105. The first insulating layer 111 may be disposed over an entire surface of the display substrate 101. The first insulating layer 111 may be a gate insulating film having a gate insulating function. The first insulating layer 111 may include a silicon compound, metal oxide, or the like. For example, the first insulating layer 111 may include silicon oxide, silicon nitride, silicon oxynitride, aluminum oxide, tantalum oxide, hafnium oxide, zirconium oxide, titanium oxide, or the like. The above materials may be used alone or in combinations thereof.

A first conductive layer 120 may be disposed on the first insulating layer 111. The first conductive layer 120 may include a gate electrode GE of a thin film transistor TFT, a first electrode CE1 of a storage capacitor Cst, and a gate signal line GSL. The gate signal line GSL may be disposed while passing the display area DA and a panel pad area PPA. The first conductive layer 120 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and a combination thereof. The first conductive layer 120 may be a single film or a stacked film made of a material selected from the above materials.

Second insulating layers 112a and 112b may be disposed on the first conductive layer 120. The second insulating layers 112a and 112b may insulate the first conductive layer 120 and a second conductive layer 130 from each other. The second insulating layer 112a is disposed roughly in the display area DA, and the second insulating layer 112b may be disposed roughly in the panel pad area P_PA. The second insulating layers 112a and 112b may be made of a material selected from the above materials of the first insulating layer 111. The second insulating layer 112b in the panel pad area P_PA may include a plurality of contact holes that partially expose the gate signal line GSL. The second insulating layer 112b is illustrated as including two contact holes in FIG. 10, but is not limited thereto, and may include one or three or more contact holes.

The second conductive layer 130 may be disposed on the second insulating layers 112a and 112b. The second conductive layer 130 may include a second electrode CE2 of the storage capacitor Cst. A material of the second conductive layer 130 may be selected from the above materials of the first conductive layer 120. The first electrode CE1 of the storage capacitor Cst and the second electrode CE2 of the storage capacitor Cst may form a capacitor through the second insulating layers 112a and 112b.

A third insulating layer 113 may be disposed on the second conductive layer 130. The third insulating layer 113 may include at least one of the above materials of the first insulating layer 111. In embodiments, the third insulating layer 113 may include an organic insulating material. The organic insulating material may be selected from materials of a first via layer VIA1 which will be described below.

A third conductive layer 140 may be disposed on the third insulating layer 113. The third conductive layer 140 may include a source electrode SE, a drain electrode DE, a high-potential voltage electrode ELVDDE, and a signal line PAD. The first conductive layer 120 may include at least one selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and a combination thereof. The third conductive layer 140 may be a single film made of a material selected from the above material. The disclosure is not limited thereto, and the third conductive layer 140 may be a stacked film. For example, the third conductive layer 140 may be formed in a stacked structure of Ti/Al/Ti, Mo/Al/Mo, Mo/AlGe/Mo, Ti/Cu, or the like. In an embodiment, the third conductive layer 140 may be formed in a stacked structure of Ti/Al/Ti.

The signal line PAD of the third conductive layer 140 may be disposed to overlap the gate signal line GSL of the first conductive layer 120 in a thickness direction and may be electrically connected to the gate signal line GSL through the contact hole CNT of the second insulating layer 112b.

The first via layer VIA1 may be disposed on the third conductive layer 140. The first via layer VIA1 may include an organic insulating material. The organic insulating material may include at least one among a polyacrylate-based resin, an epoxy resin, a phenolic resin, a polyamide-based resin, a polyimide-based resin, an unsaturated polyester-based resin, a polyphenylenether-based resin, a polyphenylene sulfide-based resin, or benzocyclobutene (BCB).

Meanwhile, upper structures of the third insulating layer 113 and the third conductive layer 140 may be removed or omitted in an area overlapping the first circuit area CA1 of the printed circuit board 500. Thus, the signal line PAD may be exposed so as to be connected to the lead lines LE in the first circuit area CA1 of the printed circuit board 500.

In embodiments, the gate signal line GSL may include a plurality of patterns, and the signal line PAD disposed on the gate signal line GSL may have an uneven surface by reflecting a stepped portion of the gate signal line GSL.

In embodiments, an auxiliary pad of the second conductive layer 130 may be further disposed between the gate signal line GSL and the signal line PAD. A planar size of the auxiliary pad may be less than a planar size of the signal line. The signal line PAD, the auxiliary pad, and the gate signal line GSL may overlap each other in the thickness direction and may be electrically connected to each other.

In embodiments, the gate signal line GSL may also be formed of the second conductive layer 130, and the signal line PAD may also be formed of a fourth conductive layer 150.

The fourth conductive layer 150 may be disposed on the first via layer VIAL. The fourth conductive layer 150 may include a data line DL, a connection electrode CNE, and a high-potential voltage line ELVDDL. The data line DL may be electrically connected to the source electrode SE of the thin film transistor TFT through the contact hole passing through the first via layer VIAL The connection electrode CNE may be electrically connected to the drain electrode DE of the thin film transistor TFT through the contact hole passing through the first via layer VIAL The high-potential voltage line ELVDDL may be electrically connected to the high-potential voltage electrode ELVDDE through the contact hole passing through the first via layer VIAL. The fourth conductive layer 150 may include a material selected from the materials of the third conductive layer 140.

A second via layer VIA2 may be disposed on the fourth conductive layer 150. The second via layer VIA2 may include at least one of the above materials of the first via layer VIA1.

An anode ANO is disposed on the second via layer VIA2. The anode ANO may be electrically connected to the connection electrode CNE through a contact hole passing through the second via layer VIA2.

A bank layer BANK may be disposed on the anode ANO. The bank layer BANK may include a contact hole which exposes the anode ANO. The bank layer BANK may be made of an organic insulating material or an inorganic insulating material. For example, the bank layer BANK may include at least one of a photoresist, a polyimide resin, an acrylic resin, a silicone compound, a polyacrylic resin, and the like.

The organic layer EL may be disposed on an upper surface of the anode ANO and in an opening of the bank layer BANK. A cathode CAT is disposed on the organic layer EL and the bank layer BANK. The cathode CAT may be a common electrode disposed over a plurality of pixels.

A thin-film encapsulation layer 170 is disposed on the cathode CAT. The thin-film encapsulation layer 170 may cover an organic light-emitting diode (OLED). The thin-film encapsulation layer 170 may be a stacked film in which an inorganic film and an organic film may be alternately stacked. For example, the thin-film encapsulation layer 170 may include a first inorganic encapsulation film 171, an organic encapsulation film 172, and a second inorganic encapsulation film 173 which may be sequentially stacked.

As described above with reference to FIGS. 1 to 6, the printed circuit board 500 may include a base film BF, a plurality of lead lines LE disposed on the first surface of the base film BF, and a first cover layer CL1 covering at least some (or at least a part) of the lead lines LE. The printed circuit board 500 may further include a second cover layer CL2. As illustrated in the right side of FIG. 10, the printed circuit board 500 is attached to the display panel 100 in a vertically overturned state, and the lead lines LE of the first circuit area CA1 may be electrically connected to signal lines of the display panel 100.

The display device 1 may further include a panel bottom sheet 200 disposed below the display panel 100.

The panel bottom sheet 200 may be attached to a back surface of the display panel 100. The panel bottom sheet 200 includes at least one functional layer. The functional layer may be a layer that performs a heat dissipation function, an electromagnetic wave shielding function, a grounding function, a buffering function, a strength reinforcing function, a supporting function, a digitizing function, and/or the like. The functional layer may be a sheet layer formed of a sheet, a film layer formed of a film, a thin film layer, a coating layer, a panel, a plate, or the like. One functional layer may be formed as a single layer but may be formed of a plurality of stacked thin films or coating layers. The functional layer may be, for example, a support substrate, a heat dissipation layer, an electromagnetic wave shielding layer, a shock-absorbing layer, a digitizer, or the like.

Referring to FIG. 11 further, a plurality of signal lines PAD may be provided, and the signal lines PAD may be arranged along the first direction DR1. For example, the signal lines PAD may include a power pad, a data pad, and a panel dummy pad.

The adhesive member AD may bond the printed circuit board 500 and the display panel 100 so that the printed circuit board 500 and the display panel 100 may be electrically connected to each other. The adhesive member AD may be a film-type member having a small thickness, for example, an anisotropic conductive film.

The adhesive member AD may include an insulating adhesive material AD_L including a thermoplastic material or a thermosetting material, and fine conductive particles AD_B formed by coating polymer particles with metal and scattered on the insulating adhesive material AD_L.

In embodiments, the lead line LE of the printed circuit board 500 may be directly bonded to the signal line PAD of the display panel 100 by ultrasonic bonding. Only the insulating adhesive material AD_L of the adhesive member AD may be interposed between the display panel 100 and the printed circuit board 500, and the conductive particles AD_B of the adhesive member AD may be omitted.

In case that the first circuit area CA1 of the printed circuit board 500 is pressed, the shape of the adhesive member AD may be modified in correspondence with an uneven structure formed due to the difference in surface heights of the lead lines LE and the fill-in portion FI of the printed circuit board 500 and an uneven structure formed due to the signal lines of the display panel 100. The adhesive member AD may be filled in at least a portion of a recess between the lead lines LE of the printed circuit board 500 and at least a portion of a recess between the signal lines of the display panel 100. The adhesive member AD may be disposed to be in direct contact with the lead line LE, the fill-in portion FI, the signal line, and the second insulating layer.

In case that the adhesive member AD is not completely filled in the uneven structure of the printed circuit board 500 and the uneven structure of the display panel 100, an air gap AGP may be formed between the adhesive member AD and the printed circuit board 500 and/or between the adhesive member AD and the display panel 100. For example, the air gap AGP may be formed in a corner area formed due to the fill-in member and the lead line LE and in the recess between the signal lines, in a cross-sectional view. In embodiments, the air gap AGP may not be present.

Figure 12:
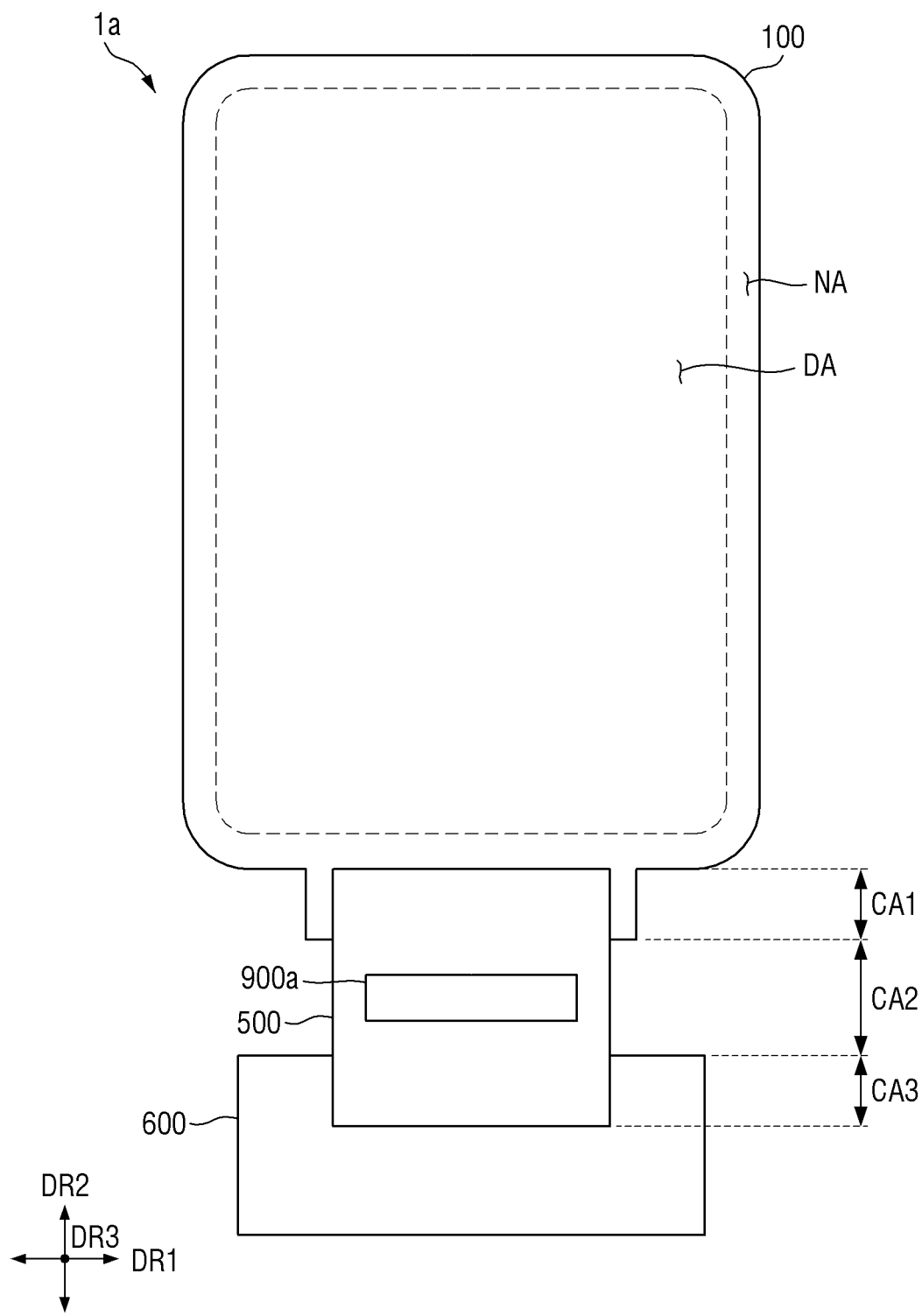
FIG. 12 is a plan view of a display device according to an embodiment.

FIG. 12 is a plan view of a display device according to an embodiment.

The embodiment illustrated in FIG. 12 is different from the embodiment illustrated in FIGS. 8 to 11 in that a driving integrated circuit 900a is disposed on a printed circuit board 500.

Referring to FIG. 12, a display device 1a may include a display panel 100, the printed circuit board 500, and a main circuit board 600.

The printed circuit board 500 may electrically connect the display panel 100 and the main circuit board 600. A first circuit area CA1 of the printed circuit board 500 may be attached to one side of the display panel 100, and a third circuit area CA3 of the printed circuit board 500 may be attached to one side of the main circuit board 600.

The driving integrated circuit 900a may be disposed on the printed circuit board 500. The printed circuit board 500 may be formed of a film-type member. For example, the driving integrated circuit 900a may be attached in a chip-on-film (COF) manner. In embodiments, as in the embodiment illustrated in FIG. 9, the printed circuit board 500 may be bent in a thickness direction such that at least a portion of the printed circuit board 500 overlaps the display panel 100.

The embodiment illustrated in FIG. 12 is substantially the same as or similar to the embodiment illustrated in FIGS. 8 to 11 except that the driving integrated circuit 900a is disposed on the printed circuit board 500, and thus, in the following, duplicated descriptions will be omitted.

Figure 13:
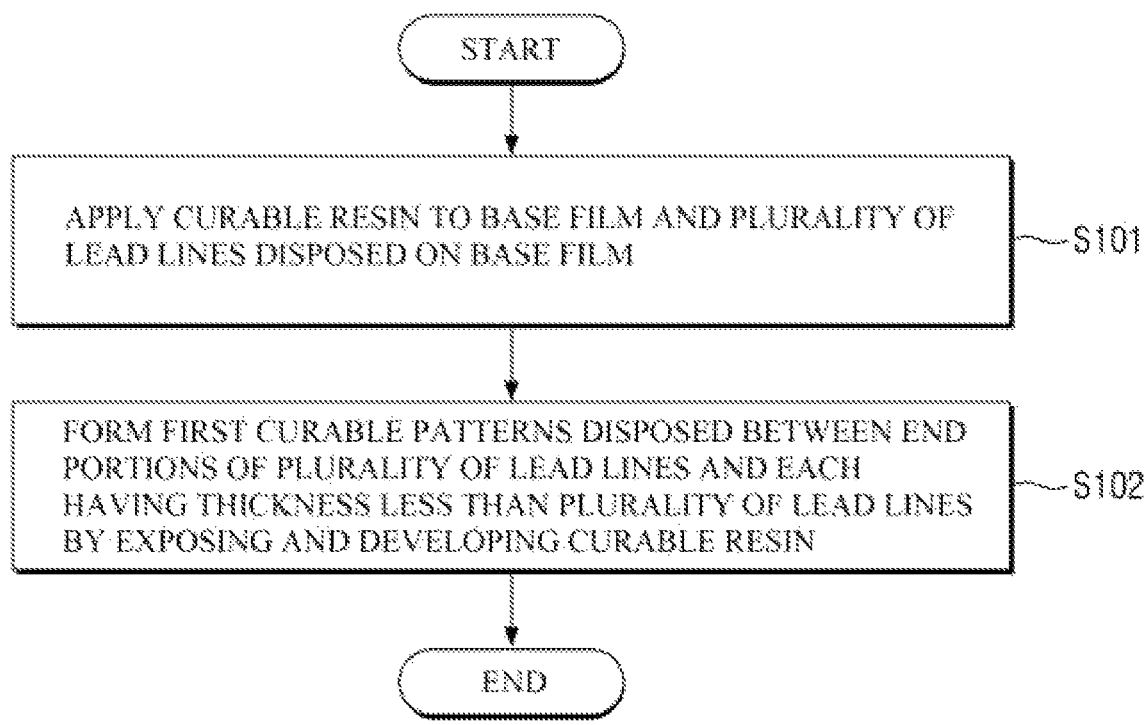
FIG. 13 is a flowchart illustrating a method of manufacturing a display device according to an embodiment.

FIG. 13 is a flowchart illustrating a method of manufacturing a display device according to an embodiment. FIGS. 14 to 17 are perspective views illustrating operations of the method of manufacturing a display device according to an embodiment.

A display device manufactured by the following display device manufacturing method may be the display device 1 of FIG. 8 or the display device 1a of FIG. 12, but the disclosure is not limited thereto. The method of manufacturing a display device may include a method of manufacturing the printed circuit board 500.

Referring to FIG. 13, the method of manufacturing a display device may include applying a curable resin CL1' to a base film BF and a plurality of lead lines LE disposed on the first surface of the base film BF (S101) and forming first curable patterns FI' disposed between the lead lines LE and each having a surface height less than those of the lead lines LE by performing exposure and development on the curable resin CL1' (S102).

The method of manufacturing a display device may further include forming a second curable pattern CV' having a surface height greater than those of the lead lines LE.

The forming of the first curable patterns FI' and the forming of the second curable pattern CV' may be performed simultaneously.

The forming of the first curable pattern FI' (S102) may include exposing the curable resin CL1' to light using a half-tone mask MSK having a light-transmitting portion FTA, a light-blocking portion BA, and a semi-transmitting portion HTA.

The exposing of the curable resin CL1' to light using the half-tone mask MSK may include exposing areas in which end portions of the lead lines LE may be disposed with light of a first intensity, exposing areas between the end portions of the lead lines LE with light of a second intensity less than the first intensity, and shielding an area, in which middle portions of the lead lines LE may be disposed, from light.

The method of manufacturing a display device may further include bonding the display panel 100 and the printed circuit board 500.

The method of manufacturing a display device is not limited to the above example, and at least one of the operations may be omitted, or at least one other operation illustrated below with reference to FIGS. 14 to 17 may be added.

Hereinafter, the method of manufacturing a display device will be described in detail with reference to FIGS. 14 to 17.

Figure 14:
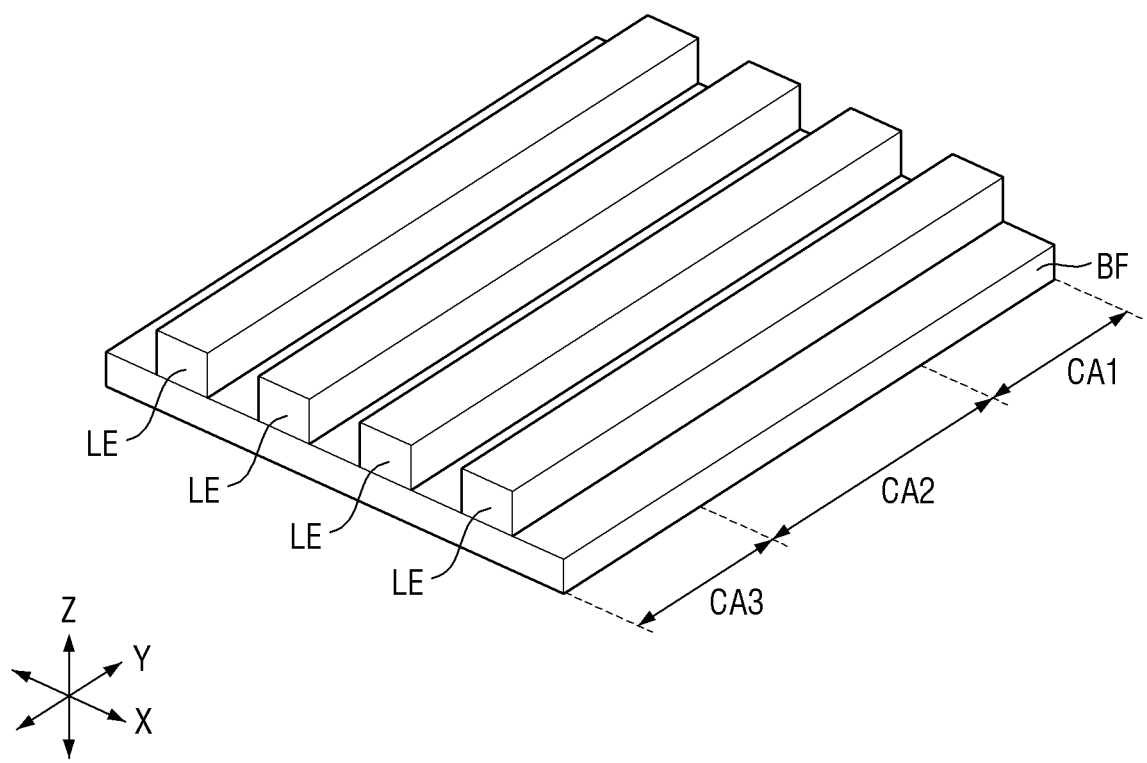
FIGS. 14 to 17 are perspective views illustrating operations of the method of manufacturing a display device according to an embodiment.

Referring to FIG. 14, the base film BF having the lead lines LE disposed on first surface thereof may be prepared. The base film BF and the lead lines LE may be the base film BF and the lead lines LE of FIGS. 1 to 6.

The base film BF may include a first circuit area CA1, a second circuit area CA2, and a third circuit area CA3. The lead lines LE may be spaced apart from each other and may be disposed to be placed over the first circuit area CA1, the second circuit area CA2, and the third circuit area CA3.

Each of both end portions of each of the lead lines LE may be disposed in each of the first circuit area CA1 and the third circuit area CA3, and a middle portion between both end portions of each of the lead lines LE may be disposed in the second circuit area CA2. The lead lines LE may each have a predetermined surface height.

Figure 15:
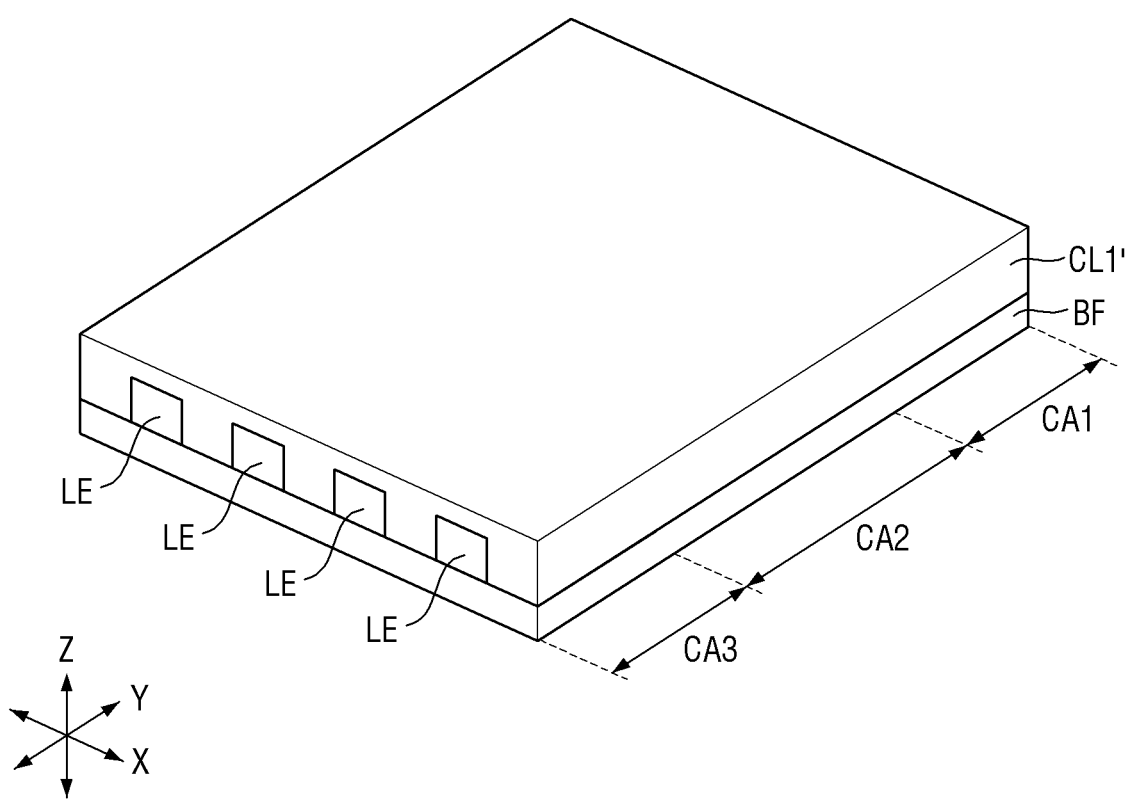

Thereafter, referring to FIG. 15, the curable resin CL1' may be applied to the base film BF. The curable resin CL1' may be applied to all of the first circuit area CA1, the second circuit area CA2, and the third circuit area CA3. A surface height of the curable resin CL1' may be greater than the surface height of each of the lead lines LE. The lead lines LE may be completely covered by the curable resin CL1'. The curable resin CL1' may include a positive-type photoresist or a negative-type photoresist. The curable resin CL1' may be an ink composition containing photosensitive polyimide.

Figure 16:
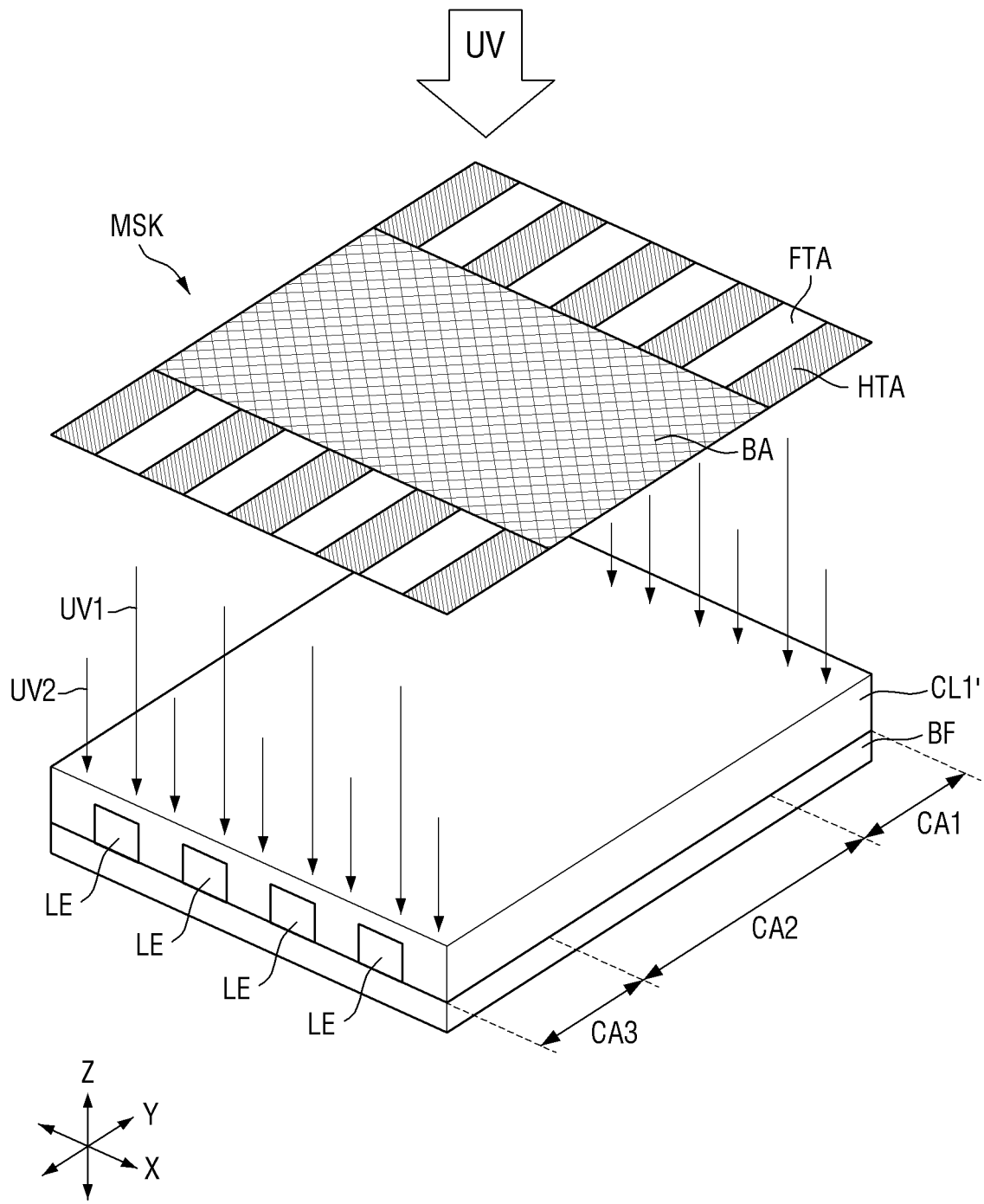

Referring to FIG. 16, after the curable resin CL1' is applied, the curable resin CL1' may be exposed to ultraviolet light. In an embodiment, the ultraviolet light exposure may be performed using the half-tone mask MSK. Although the exposure and development process using a positive-type photoresist is illustrated below, it should be understood that the exposure and development process may also be performed using a negative-type photoresist.

In an embodiment, a light source may be disposed above the first surface of the base film BF so that the first surface may be directly exposed to ultraviolet light. In embodiments, the light source may be disposed above the second surface of the base film BF, and ultraviolet light is transmitted through the base film BF so that the curable resin CL1' is exposed to the ultraviolet light.

The half-tone mask MSK is disposed between the light source and the curable resin CL1'. The half-tone mask MSK may include the light-transmitting portion FTA transmitting most of the light, the light-blocking portion BA blocking the light, and the semi-transmitting portion HTA having a controlled transmittance so that the light is partially transmitted therethrough.

A plurality of light-transmitting portions FTA, a plurality of semi-transmitting portions HTA, and the light-blocking portion BA may be disposed so as to correspond to the areas in which the end portions of the lead lines LE may be disposed, the areas between the lead lines LE, and the middle portions of the lead lines LE, respectively. In more detail, the light-transmitting portions FTA and the semi-transmitting portions HTA may be disposed to overlap the first circuit area CA1 and the third circuit area CA3, respectively, in a thickness direction, and the light-blocking portion BA may be disposed to overlap the second circuit area CA2 in the thickness direction.

In the ultraviolet light exposure, the areas in which the end portions of the lead lines LE are disposed may be exposed to light UV1 of a first intensity passing through the light-transmitting portions FTA, the areas between the end portions of the lead lines LE may be exposed to light UV2 of a second intensity, which is less than the first intensity, passing through the semi-transmitting portions HTA, and the area in which the middle portions of the lead lines LE may be disposed may be shielded from light.

Figure 17:
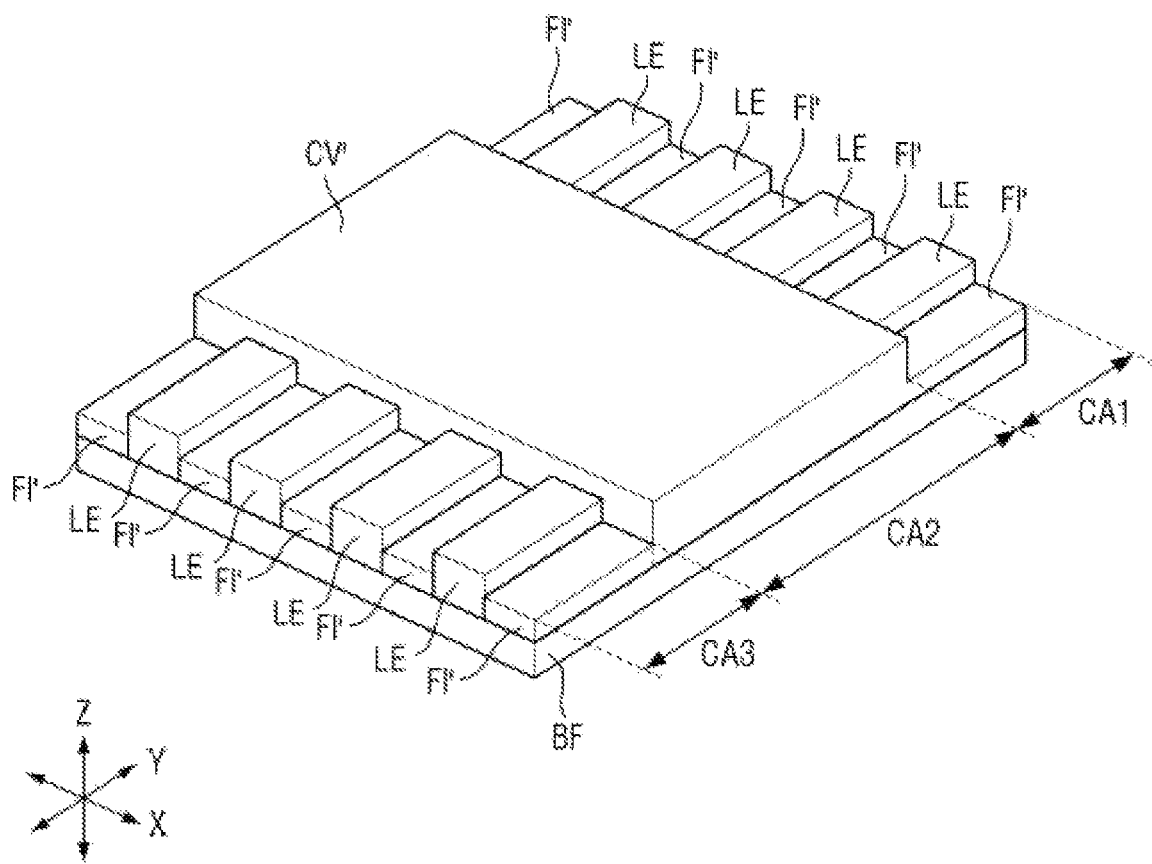

Referring to FIG. 17, after exposing the curable resin CL1', the curable resin CL1' may be developed using a developing solution. A first cured layer may be formed on the first surface of the base film BF due to the development. The first cured layer may include the first curable pattern FI' and at least one second curable pattern CV'. The first cured layer having the first curable pattern FI' and the at least one second curable pattern CV' formed therein may be the first cover layer CL1 of FIGS. 1 to 6.

Some portions (or at least a part) of the curable resin CL1' disposed in the first circuit area CA1 and the third circuit area CA3 may be removed to form the first curable patterns FI'. The first curable patterns FI' may be disposed between the lead lines LE and may each have a surface height less than those of the lead lines LE. The first curable patterns FI' may be the fill-in portions FI of FIGS. 1 to 6.

Mother portion of the curable resin CL1' disposed in the second circuit area CA2 may remain to form the second curable pattern CV'. The second curable pattern CV' may have a surface height greater than those of the lead lines LE. The second curable pattern CV' may be the cover portion CV of FIGS. 1 to 6.

In an embodiment, the first curable patterns FI' and the second curable pattern CV' may be simultaneously formed by a single exposure and development process. In embodiments, the first curable patterns FI' and the second curable pattern CV' may be sequentially formed by a plurality of exposure and development processes.

A printed circuit film including the base film BF, the lead lines LE, and the first cover layer CL1 may be manufactured by the above-described processes. In embodiments, a second cover layer CL2 may be further formed on the second surface of the base film BF.

Subsequently, as illustrated in FIGS. 10 and 11, the base film BF may be attached to the display panel 100 by the adhesive member AD so that the exposed lead lines LE may be electrically connected to the signal lines.

Although not illustrated in the drawing, in embodiments, the method of manufacturing a display device may further include forming a third curable pattern on the second surface of the base film BF. The second cover layer CL2 of FIGS. 1 to 12 may be formed by curing the third curable pattern.

In a printed circuit board, a display device, and a display device manufacturing method according to an embodiment, manufacturing processes can be simplified and lead lines can be prevented from being migrated.

Effects according to the embodiments are not limited to the description of this disclosure, and more various effects are included in the specification.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A printed circuit board comprising:
   a base film including a first surface and a second surface;
   a plurality of lead lines disposed on the first surface of the base film; and
   a first cover layer that covers at least a part of the plurality of lead lines and includes a plurality of fill-in portions disposed between the plurality of lead lines, each of the plurality of fill-in portions having a surface height less than a surface height of each of the plurality of lead lines with respect to the first surface of the base film, wherein
   the first cover layer includes a cover portion having a surface height greater than the surface height of each of the plurality of lead lines,
   the plurality of fill-in portions expose an end portion of each of the plurality of lead lines, and
   the cover portion covers a middle portion of each of the plurality of lead lines.

2. The printed circuit board of claim 1, wherein the plurality of fill-in portions expose a surface of each of the plurality of lead lines and cover at least a part of side surfaces of each of the plurality of lead lines, the side surfaces of each of the plurality of lead lines being connected to the surface of each of the plurality of lead lines.

3. The printed circuit board of claim 2, wherein the plurality of fill-in portions directly contact the first surface of the base film and the side surfaces of each of the plurality of lead lines.

4. The printed circuit board of claim 1, wherein the cover portion covers a surface of each of the plurality of lead lines and side surfaces which are connected to the surface.

5. The printed circuit board of claim 1, wherein the cover portion and the plurality of fill-in portions are integral with each other and include a same material.

6. The printed circuit board of claim 1, wherein the first cover layer includes a photosensitive insulating material.

7. The printed circuit board of claim 6, wherein the photosensitive insulating material includes photosensitive polyimide.

8. The printed circuit board of claim 1, wherein the plurality of fill-in portions and the plurality of lead lines form an uneven structure.

9. The printed circuit board of claim 1, wherein the first cover layer is disposed directly on the first surface of the base film.

10. The printed circuit board of claim 1, further comprising a second cover layer disposed on the second surface of the base film.

11. The printed circuit board of claim 10, wherein the first cover layer and the second cover layer include a same material.

12. A printed circuit board comprising:
a base film including a first surface and a second surface;
a plurality of lead lines disposed on the first surface of the base film; and
a first cover layer that covers at least a part of the plurality of lead lines and includes a plurality of fill-in portions disposed between the plurality of lead lines, each of the plurality of fill-in portions having a surface height less than a surface height of each of the plurality of lead lines with respect to the surface of the base film, wherein
the first cover layer includes a stepped portion that exposes an end portion of each of the plurality of lead lines.

13. A display device comprising:
a display panel including a plurality of signal lines; and
a printed circuit board disposed on the display panel and including:
a base film;
a plurality of lead lines disposed on a surface of the base film and electrically connected to the plurality of signal lines;
a cover layer covering at least a part of the plurality of lead lines; and
a plurality of fill-in portions disposed between the plurality of lead lines, each of the plurality of fill-in portions having a surface height less than a surface height of each of the plurality of lead lines with respect to the surface of the base film, wherein
the cover layer includes a stepped portion that exposes an end portion of each of the plurality of lead lines.

14. The display device of claim 13, wherein the cover layer includes a photosensitive insulating material.

\* \* \* \* \*